United States Patent [19]

Maya

[11] Patent Number: 5,320,878
[45] Date of Patent: Jun. 14, 1994

[54] METHOD OF CHEMICAL VAPOR DEPOSITION OF BORON NITRIDE USING POLYMERIC CYANOBORANE

[75] Inventor: Leon Maya, Oak Ridge, Tenn.

[73] Assignee: Martin Marietta Energy Systems, Inc., Oak Ridge, Tenn.

[21] Appl. No.: 819,688

[22] Filed: Jan. 10, 1992

[51] Int. Cl.$^5$ .................. C23C 16/34; C23C 16/50; B05D 3/06
[52] U.S. Cl. .................. 427/573; 427/576; 427/597; 427/248.1; 427/337
[58] Field of Search .................. 427/249, 255.1, 248.1, 427/573, 576, 595, 597, 372.2, 337

[56] References Cited

U.S. PATENT DOCUMENTS

| | | | |
|---|---|---|---|
| 4,758,539 | 7/1988 | Brown et al. | 501/96 |
| 4,970,095 | 11/1990 | Bolt et al. | 427/226 |
| 5,023,213 | 6/1991 | Maya | 501/96 |
| 5,030,744 | 7/1991 | Funayama et al. | 528/12 |
| 5,169,613 | 12/1982 | Shore et al. | 423/406 |
| 5,175,020 | 12/1992 | Doellein et al. | 427/569 |

OTHER PUBLICATIONS

Maya, et al. "Polymeric Cyanoborane, $(CNGH_2)_n$:Single Source for Chemical Vapor Deposition of boron Nitride Films," *J. Am. Ceram. Soc.*, 74,2 406–409 (Feb. 1991).

A. Lipp, et al. "Hexagonal Boron Nitride: Fabrication, Properties and Applications," *J. of European Ceram. Soc.*, 5, (1989), 3–9.

S. P. S. Arya, et al. "Preparation, Properties and Applications of Boron Nitride Thin Films," *Thin Solid Films*, 157, (1988), 267–282.

*Primary Examiner*—Shrive Beck
*Assistant Examiner*—Bret Chen
*Attorney, Agent, or Firm*—Joseph A. Marasco; Harold W. Adams

[57] ABSTRACT

Polymeric cyanoborane is volatilized, decomposed by thermal or microwave plasma energy, and deposited on a substrate as an amorphous film containing boron, nitrogen and carbon. Residual carbon present in the film is removed by ammonia treatment at an increased temperature, producing an adherent, essentially stoichiometric boron nitride film.

29 Claims, 11 Drawing Sheets

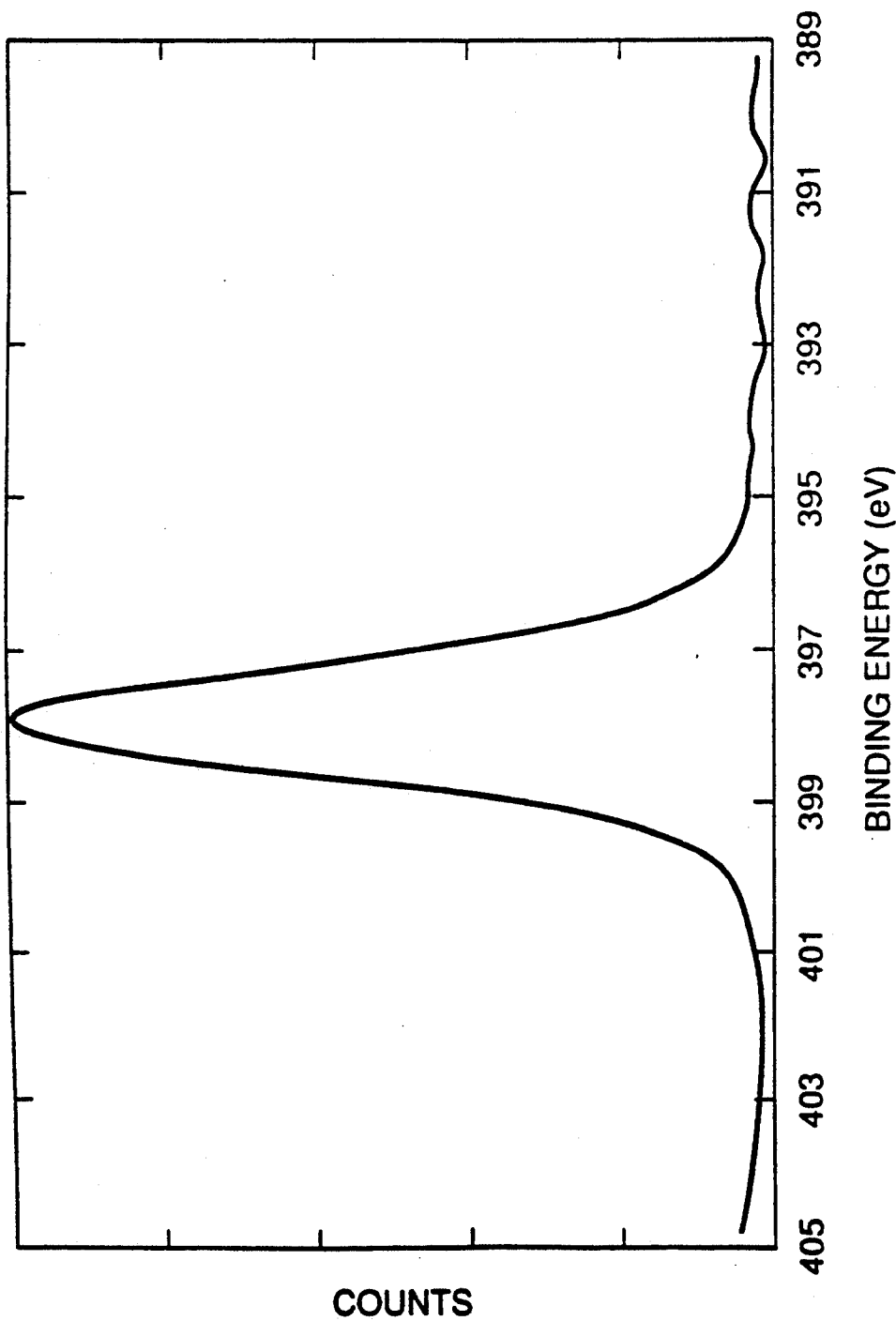

METHOD OF CHEMICAL VAPOR DEPOSITION OF BORON NITRIDE USING POLYMERIC CYANOBORANE

The United States Government has rights in this invention pursuant to contract no. DE-AC05-84OR21400 between the United States Department of Energy and Martin Marietta Energy Systems, Inc., and funded by the Office of Basic Energy Sciences.

FIELD OF THE INVENTION

The present invention relates to chemical vapor deposition (CVD) methods of depositing boron nitride films on substrates, and more particularly to such methods which utilize polymeric cyanoborane as a source material.

BACKGROUND OF THE INVENTION

Boron nitride (BN) is a compound of increasing importance for a variety of technological applications that take advantage of the beneficial properties of this material, such as its chemical inertness, high melting point, low density, high resistivity, high thermal conductivity and, in the case of the cubic form, an exceptionally high hardness. Additional applications, particularly in electronic devices, have been found for this material when applied as a thin film such as protective coatings, dielectric layers, diffusion sources, heat dissipation coatings, passivation layers, photoconductors, diffusion masks, wear resistant coatings, etc. Boron nitride films are deposited, with difficulty, on a variety of substrates by CVD, plasma enhanced CVD (PECVD), sputtering, electron beam evaporation, and ion beam deposition methods. Independent sources of a boron-containing species and a nitrogen-containing species are generally required for these methods.

Conventional methods of depositing films of BN require the use of flowing streams of a boron source such as boron trichloride or diborane and a nitrogen source such as ammonia into a hot reactor containing the substrate to be coated. The preparation of stoichiometric BN films requires close control of the ratio of reactant gases introduced into the deposition zone of the reactor. Complex metering equipment of expensive and/or hazardous materials are required. The quality of the resulting coatings is difficult to control and dependent on a highly accurate feeding of the appropriate proportions of reacting gases. These methods are generally not efficient, creating the need for trapping, disposal or recycling of unreacted feed material or gaseous by-products produced in the hot zone. Some methods require the use of microwaves to generate plasmas to enhance the rates of the reactions.

Two recent review articles, A. Lipp, et al., *Journal of the European Ceramic Society*, 5, (1989), 3-9, and S. P. S. Arya, et al., *Thin Solid Films*, 157, (1988), 267-282, describe preparation methods, properties, and applications of boron nitride films as well as a general description of the preparation, properties and applications of hexagonal boron nitride.

OBJECTS OF THE INVENTION

Accordingly, it is an object of the present invention to provide a new and improved method of depositing boron nitride films on substrates which utilizes a single source material.

It is another object of the present invention to provide a new and improved method of depositing boron nitride films on substrates which does not require highly accurate feeding of appropriate proportions of reactants.

It is further object of the present invention to provide a new and improved method of depositing boron nitride films on substrates which does not require disposal or recycling of unreacted feed material or gaseous by-products.

Further and other objects of the present invention will become apparent from the description contained herein.

SUMMARY OF THE INVENTION

In accordance with one aspect of the present invention, the foregoing and other objects are achieved by a method of depositing boron nitride onto a substrate which comprises the steps of:

a. providing a substrate, the substrate having a surface, the substrate being held at a sufficient temperature to effect decomposition of cyanoborane; and, b. contacting the substrate with cyanoborane vapor so that a film comprising boron nitride is deposited on the surface to produce a coated substrate.

In accordance with another aspect of the present invention, a method of depositing boron nitride onto a substrate comprises the steps of:

a. providing a substrate, the substrate having a surface, the substrate being held at a sufficient temperature to effect decomposition of cyanoborane;

b. thermally vaporizing cyanoborane to form a cyanoborane vapor; and, c. contacting the substrate with the cyanoborane vapor so that a film comprising boron nitride is deposited on the surface to produce a coated substrate.

In accordance with a further aspect of the present invention, a method of depositing boron nitride onto a substrate comprises the steps of:

a. immersing a substrate in a plasma of inert gas, the substrate having a surface; and, b. contacting cyanoborane vapor with the substrate so that the plasma effects decomposition of the cyanoborane vapor and a film comprising boron nitride is deposited on the surface to produce a coated substrate.

In accordance with a still further aspect of the present invention, a method of depositing boron nitride onto a substrate comprises the steps of:

a. providing a substrate, the substrate having a surface, the substrate being immersed in a plasma of inert gas;

b. thermally vaporizing cyanoborane to form a cyanoborane vapor; and, c. contacting the substrate with the cyanoborane vapor so that the plasma effects decomposition of the cyanoborane vapor and a film comprising boron nitride is deposited on the surface to produce a coated substrate.

BRIEF DESCRIPTION OF THE DRAWING

In the drawing:

FIG. 5a is a graph showing an XPS nitrogen 1s peak of a BN standard.

For a better understanding of the present invention, together with other and further objects, advantages and capabilities thereof, reference is made to the following disclosure and appended claims in connection with the above-described drawings.

DETAILED DESCRIPTION OF THE INVENTION

Polymeric cyanoborane, $(CNBH_2)n$, is a solid compound prepared by passing hydrogen chloride through a suspension of sodium cyanotrihydroborate ($NaBH_3CN$) in ethyl ether. See B. F. Spielvogel et. al., "Cyanoborane Chemistry. I. Preparation of a Novel Series of Macrocyclic Cyanoboranes," J. Amer. Chem. Soc. 94 [24] 8597-98 (1972). The following equation describes the general reaction, where n represents a molecule or a polymer chain of 2 to about 30 units:

It should be noted that some recent reports warn of possible explosions involving polymeric cyanoborane prepared using dimethyl sulfide as a solvent. In one instance a delayed explosion occurred after scraping the product from the walls of a glass container; furthermore, faint cracking noises were audible upon grinding small amounts in a mortar. Attempts to detonate small amounts of the cyanoborane products obtained in the course of our work failed to produce any decomposition either by scraping or shock with a heavy object.

The cyanoborane can be isolated from the raw reaction product by filtration to eliminate the solid sodium chloride by-product followed by solvent evaporation. However, isolation and purification are not necessary for carrying out the present invention. The raw product is a free flowing powder that is equally effective in producing BN coatings as purified cyanoborane. The presence of the salt may possibly reduce even further any potential explosion hazard.

Cyanoborane, molecular or polymeric, provides a convenient single source material for the chemical vapor deposition of boron nitride on a variety of substrates. The simplicity in preparation and handling, as well as the composition of the coating, makes polymeric cyanoborane an attractive source for the deposition of boron nitride films.

Thermally Activated CVD

Figure 1:
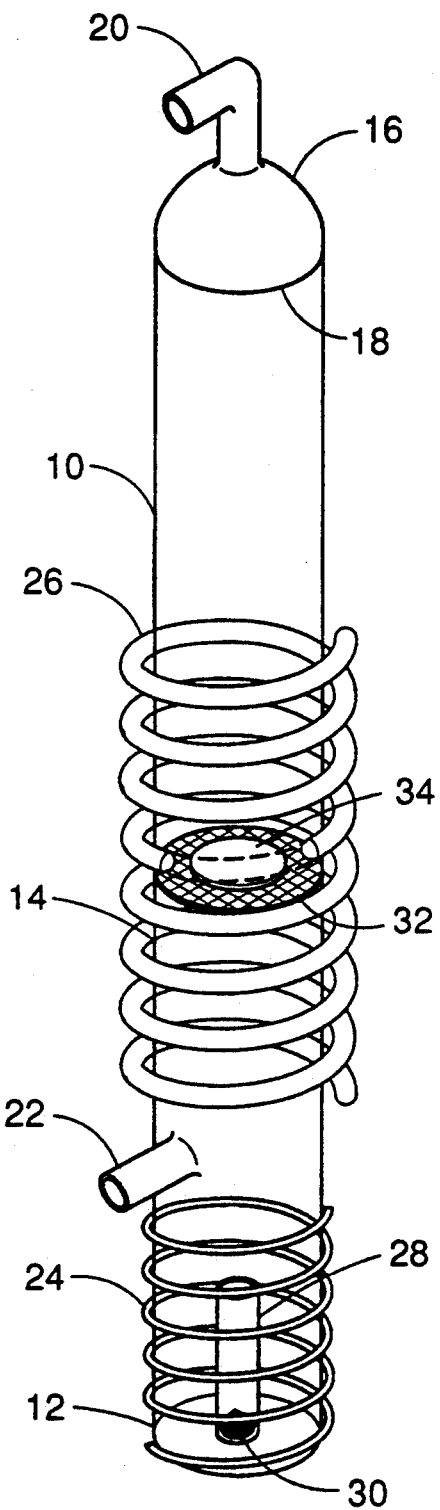
FIG. 1 is a schematic sectional side view of apparatus suitable for carrying out a thermally activated CVD method according to the invention.

Apparatus useful for carrying out the invention is shown in FIG. 1. A typical CVD system is described as follows. A quartz CVD tube 10 has a vapor source region 12 for generating chemical vapor, a deposition region 14 for supporting a substrate, and an exhaust region 16 comprising access means 18 such as threaded or tapered connection, and vacuum connection 20. A gas inlet 22 is provided between the source region 12 and deposition region 14. The source region 12 is provided with a first heating means 24 such as a mantle or heat tape. The deposition region 14 is situated within a second heating means 26 such as a tube furnace. A smaller tube 28 containing polymeric cyanoborane 30 is placed within the source region 12. A substrate support 32 is placed in the deposition region, and a substrate 34 is placed on the support 32.

The system is closed and evacuated, and the second heating means 26 is utilized to heat the substrate 32 to a temperature in the range of about 400° C. to about 800° C., more preferably in the range of about 500° C. to about 700° C., most preferably about 600° C. for best control of the rate of decomposition of cyanoborane in the apparatus described herein. By activating the first heating means 24, the temperature of the source region 12 is increased to a temperature in the range of about 80° C. to about 300° C., more preferably in the range of about 140° C. to about 200° C., most preferably about 170° C. for best control of the rate of evaporation of cyanoborane in the apparatus described herein. The polymeric cyanoborane readily evaporates to produce an adherent film on the surface of the substrate 34. This crude film, usually amber in color, has a nominal composition corresponding to $C_{0.5}BN$. The crude film shows the typical infrared spectrum of boron nitride. The temperature of the deposition region is raised to a temperature in the range of about 700° C. to about 1200° C., more preferably in the range of about 750° C. to about 850° C., most preferably about 800° C. for the most economical operation of the described apparatus. Ammonia ($NH_3$) is introduced into the system through the gas inlet 22. Exposure of the film to ammonia at such temperatures removes the carbon to yield stoichiometric boron nitride in the form of an amorphous film. The ammonia treatment produces a dramatic enhancement in the intensity and sharpness of the infrared spectrum of the film, and significantly increases the amount of visible light transmitted through the coating.

EXAMPLE I

A CVD apparatus comprising a CVD tube about 1½ inches in diameter and about 20 inches in length was loaded with a small test tube, about ½ inch in diameter and about 3 inches in length, containing about 230 mg of polymeric cyanoborane. The tube containing the cyanoborane was placed in the source region at the bottom of the CVD tube, and a silicon wafer about 1 inch in diameter was placed on a support in the deposition region at about 10 inches from the bottom. The assembly was closed and connected to a vacuum line. The deposition region was heated to about 600° C. At this point the source region was heated to about 150° C. to evaporate the cyanoborane. This was accomplished over about a 2 hour period. The assembly was cooled and the silicon wafer was retrieved and weighed. A 3.33 mg increase in weight corresponded approximately to a thickness of about 1.5 μm boron nitride. The wafer containing the crude coating, found to contain about 19% carbon, was subjected to ammonia treatment for about 3 hours, by passing ammonia through the deposition region, held at 800° C. The wafer lost 0.63 mg, corresponding to about 19% of the original weight. The weight loss was found to be due to carbon loss, leaving a coating that is stoichiometric boron nitride.

EXAMPLE II

To establish whether the decrease in carbon content was due to the ammonia or the thermal treatment, a wafer was coated as described in Example I at about 600° C. and then treated by heating to about 800° C. under vacuum. The treated film contained about 19 wt % carbon, thus demonstrating that the ammonia treatment caused the elimination of carbon.

EXAMPLE III

A similar process as that described in Example I was conducted with a different condition in that the cyanoborane was not separated from the salt by-product; the raw reaction product was used. A 407 mg portion of cyanoborane containing salt by-product was loaded into the test tube, and processed as described in example I. The salt did not interfere with the evaporation or deposition of the cyanoborane and remained in the test tube. This salt residue contained a very small fraction of the initial boron.

EXAMPLE IV

A similar process as that described in Example 1 was conducted with an different condition in that about half of the amount polymeric cyanoborane (about 115 mg) was used. This process deposited an adherent coating that was determined to be about 0.7 μm thick.

EXAMPLE V

In a process similar to example I, an adherent coating of boron nitride was deposited on a disc of sapphire.

EXAMPLE VI

In a process similar to example I, an adherent coating of boron nitride was deposited on a calcium fluoride window.

EXAMPLE VII

In a process similar to example I, an adherent coating of boron nitride was deposited on a quartz substrate.

EXAMPLE VIII

In a process similar to example I, an adherent coating of boron nitride was deposited on a platinum substrate.

The present invention provides a method which is particularly useful due to a number of important advantages, including the following:

1. The use of a single solid source to provide both boron and nitrogen. The solid is easily prepared in a single step from commercially available products.
2. The coating procedure is very simple, requiring no sophisticated equipment other than a temperature controlled furnace.
3. Use of the cyanoborane polymer obviates the need for recycling since all the material is consumed in the hot zone.
4. Use of a closed system rather than flowing streams of reactants gives better control and minimizes sources of contamination which might degrade the quality of the coating.
5. There is no need to meter the ammonia used to eliminate carbon from the coating, a slow flow to provide an atmosphere is quite suitable.

The crude coating has also a very high electrical resistance, implicating suitability for some insulating applications, obviating the need for the ammonia treatment and related exposure of the substrate to higher treatment temperatures.

The coating process is not limited to flat substrates and lends itself nicely to coating of ceramic fibers that are used in ceramic composites. Coating of fibers is required to modify the bonding characteristics between fibers and different matrices.

The products resulting from the subject method were characterized as follows:

Carbon was determined on coated silicon wafers. The entire wafer was subjected to analysis. Uncoated wafers were also analyzed to establish a blank value. Carbon analyses of coated wafers showed that the crude films contained about 18 wt % carbon, and ammonia treated films contained about 3 wt % carbon. An additional interesting observation is that consistently the weight losses of ammonia treated coatings were about 18%, thus showing that the ammonia treatment specifically removed carbon. Presumably the 3 wt % residual carbon in the ammonia treated wafer may be reduced further by longer treatment periods.

Boron was analyzed by inductively coupled plasma spectroscopy (ICP) after stripping the coating in boiling $HNO_3$-$H_2O_2$. Boron analyses showed 36 and 38.6 wt % for two independently prepared crude coatings, while that of an ammonia treated film showed 40.4 wt %. The theoretical value for pure boron nitride is 43.5 wt %. Composition as a function of depth, as revealed by Auger spectroscopy, showed no oxygen other than surface contamination. The nitrogen content was calculated by difference after establishing the concentration of the other elements. These analyses revealed that the crude coating has a composition that corresponds approximately to $CB_2N_2$ while that of the ammonia treated film approaches closely stoichiometric boron nitride.

The effect of the ammonia treatment on the crude film is apparent to the naked eye. Transmitted light increased dramatically after treatment.

Figure 2A:
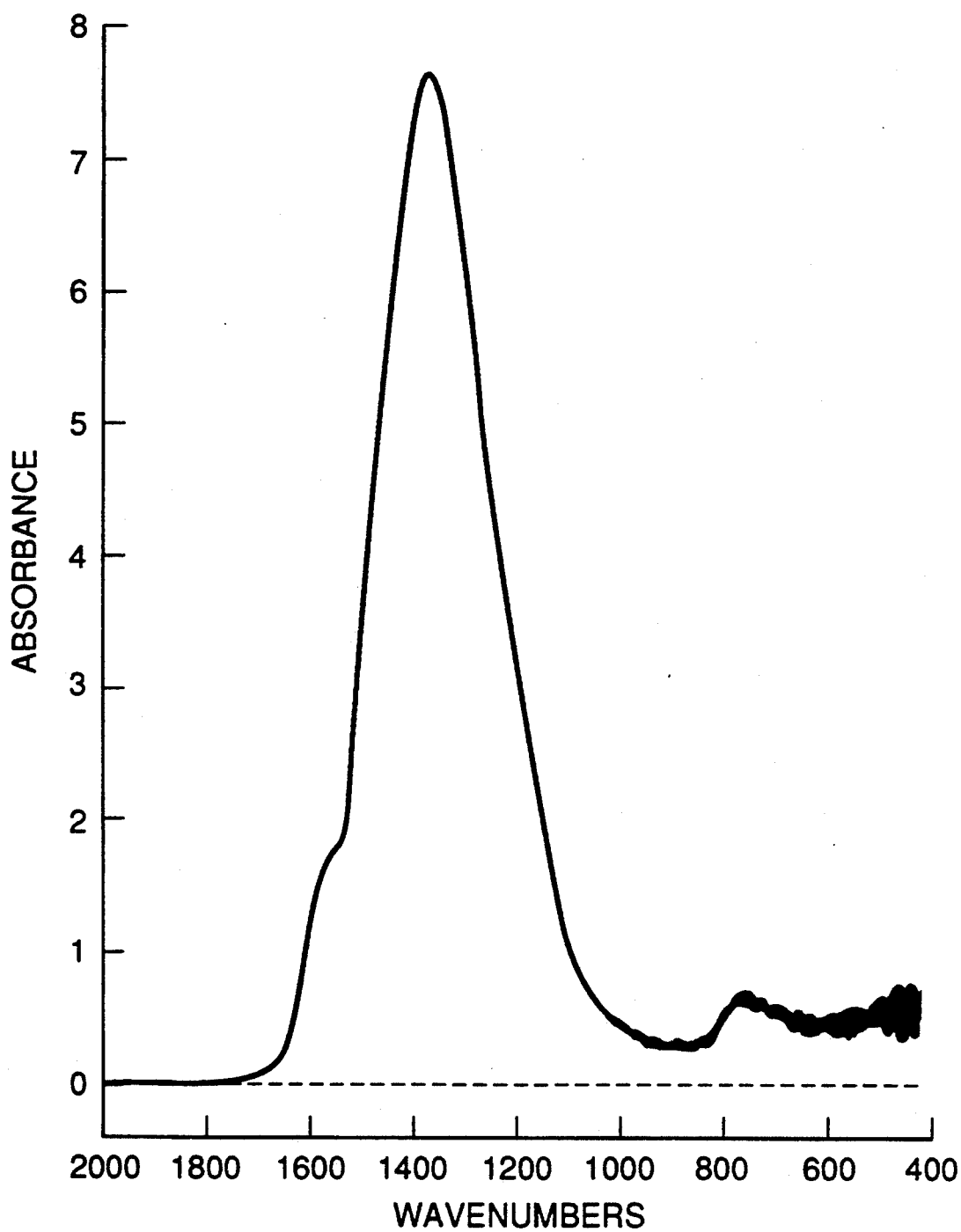
FIG. 2a is a graph showing an infrared spectrum of a crude film deposited according to the invention.
Figure 2B:
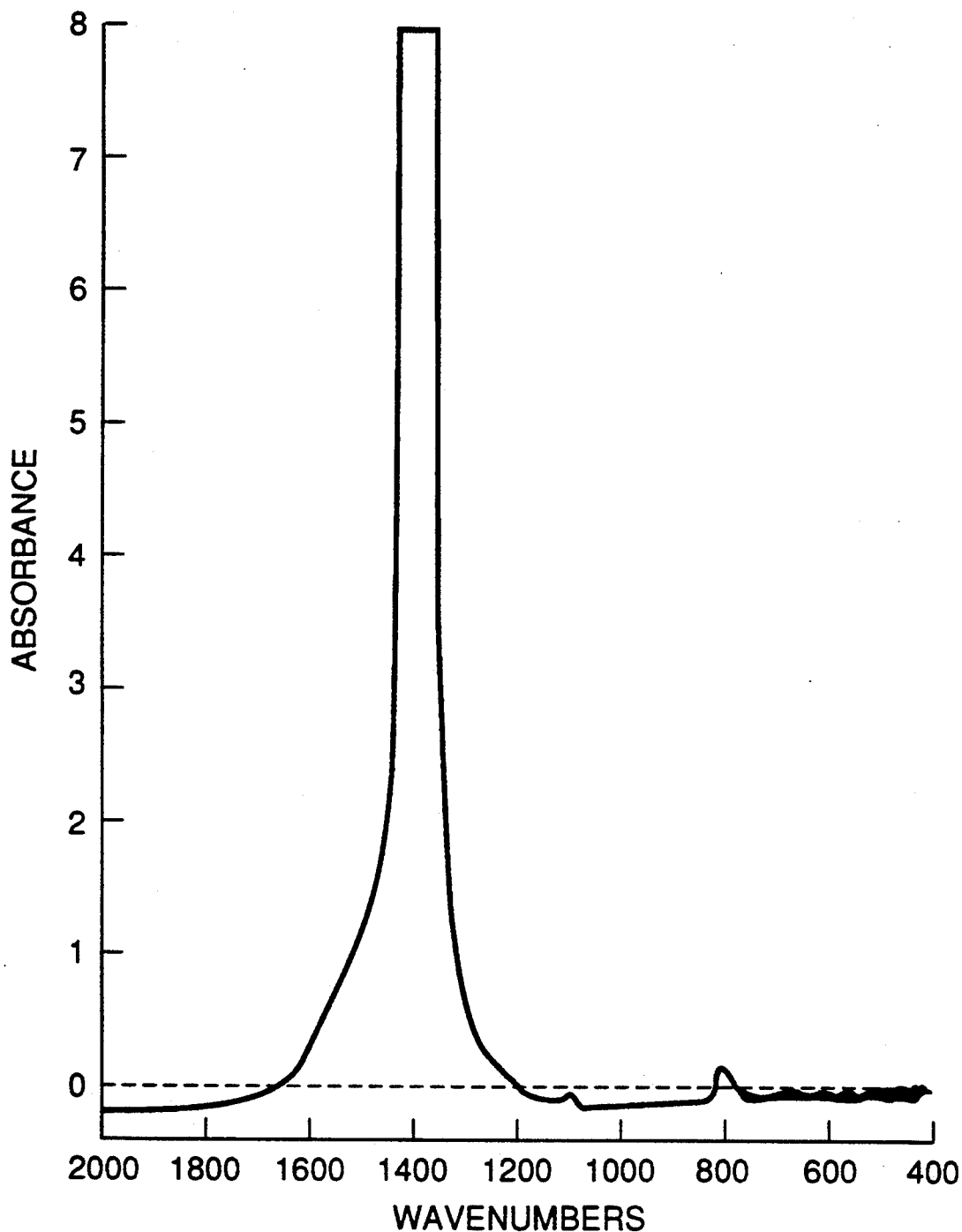
FIG. 2b is a graph showing an infrared spectrum of an ammonia treated film deposited according to the invention.

Infrared spectra of the crude coating and the ammonia treated film were obtained from deposits on either $CaF_2$ or silicon. The IR spectrum of boron nitride is characterized by two bands appearing at 1400 and 800 cm$^{-1}$. The first band is assigned to BN stretching motions while the lower energy band is attributed to BNB bending. A dramatic change in the intensity and width of the stretching band was found upon removal of the carbon from the film as a result of the ammonia treatment. This effect is illustrated in FIG. 2a and 2b, which show, respectively, the spectra of a BN film deposited on silicon before and after ammonia treatment. The shoulder observed at about 1580 cm$^{-1}$ is apparently due to carbon; an additional band, also due to carbon, at 1360 cm$^{-1}$ is obscured by the BN band. The assignment of these bands to carbon are based on observations of spectra of carbonaceous materials and is consistent with the disappearance of these bands upon carbon removal, as shown in FIG. 2b. The absence of any CH, NH or BH vibrations in the spectra apparently reflects the lack of a significant amount of hydrogen in the source material as compared with materials deposited in flow reactors with high ratios of $NH_3$ to $B_2H_6$.

Attempts were made to establish whether the film was crystalline and to identify the polymorph present. X-ray diffraction (XRD) studies on a coated silicon wafer, taken at a grazing angle, showed a broad absorption characteristic of amorphous material.

Transmission electron microscopy (TEM) conducted on a film that had been removed from a sapphire substrate with 5% HF and subsequently subjected to ion milling showed no diffraction pattern, and thus confirmed the XRD observation concerning the amorphous nature of the film. TEM revealed no features on the film even at a 8500× magnification.

The microstructure of coated silicon wafers, either single crystal or multigrain, as revealed by scanning electron microscopy (SEM) at a 1000× magnification, is identical with that of uncoated specimens, thus, it is apparent that, at the applied thickness of about 1 μm, the film conforms very well to the surface of the substrate.

Resistance measurements taken at a 3 mm lead separation were on the order of $10^{15}$ Ohm for both the crude and treated films.

Figure 3:
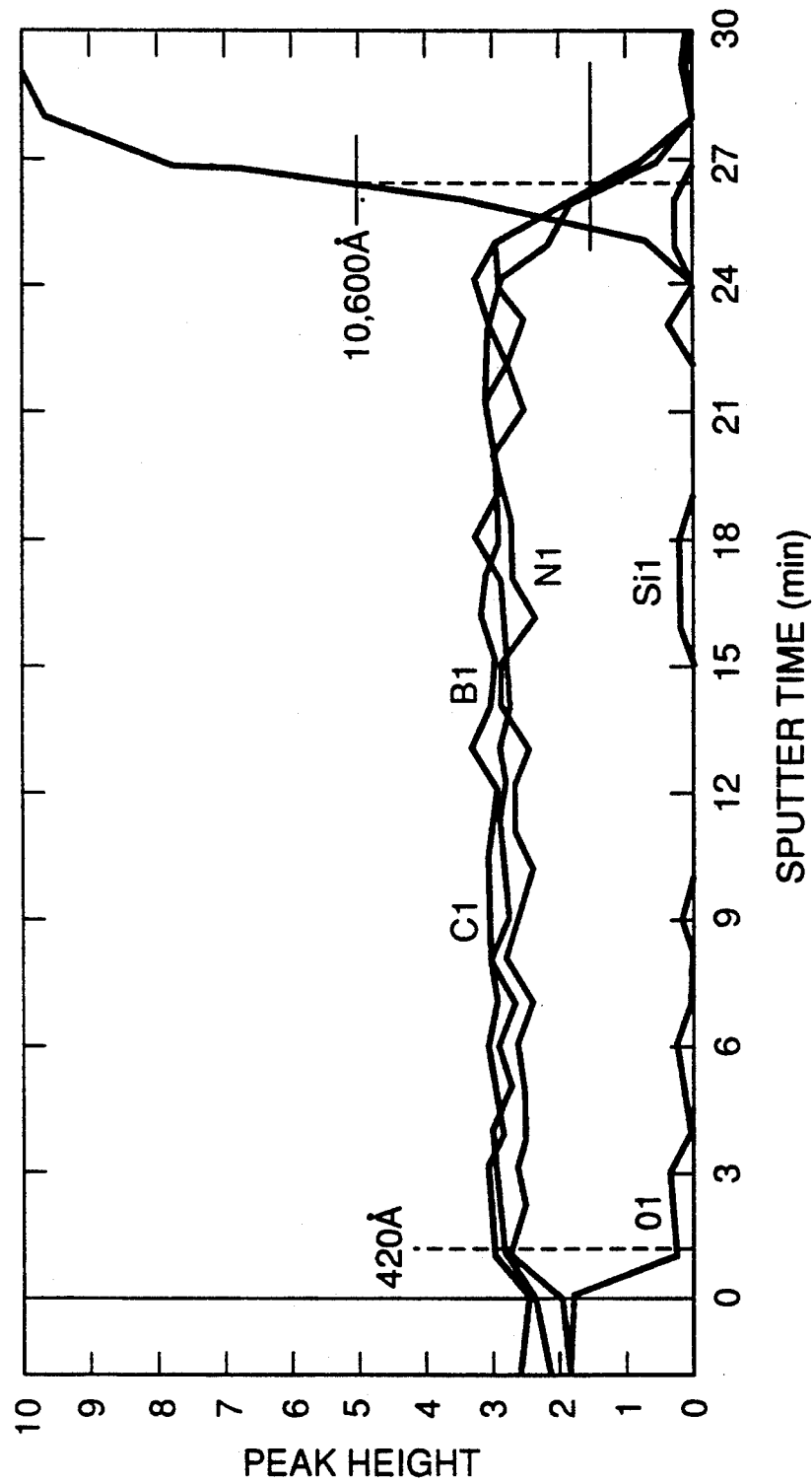
FIG. 3 is a graph showing a sputter depth profile of crude film deposited according to the invention.
Figure 4A:
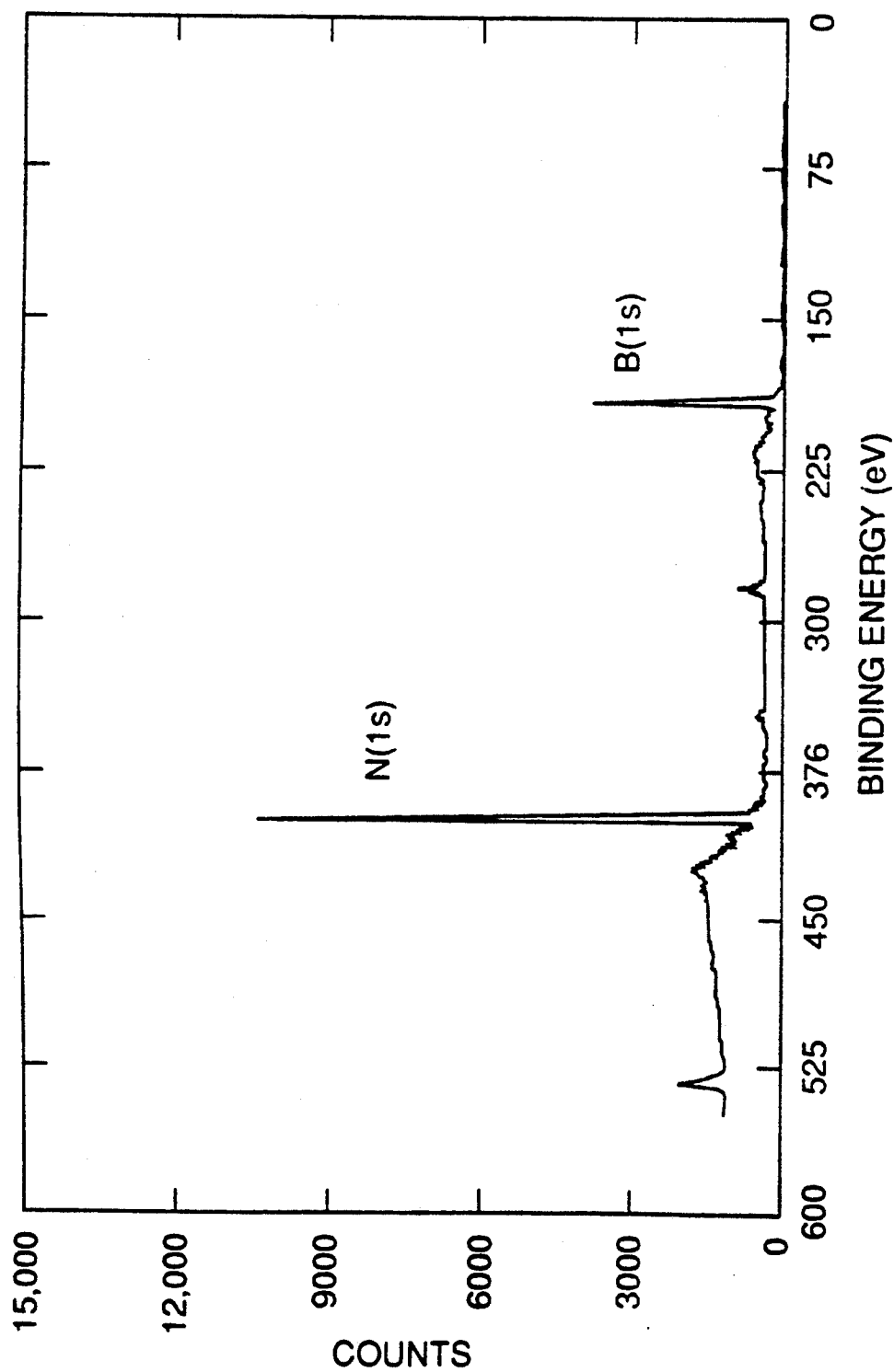
FIG. 4a is a graph showing an XPS survey spectrum of a BN standard.
Figure 4B:
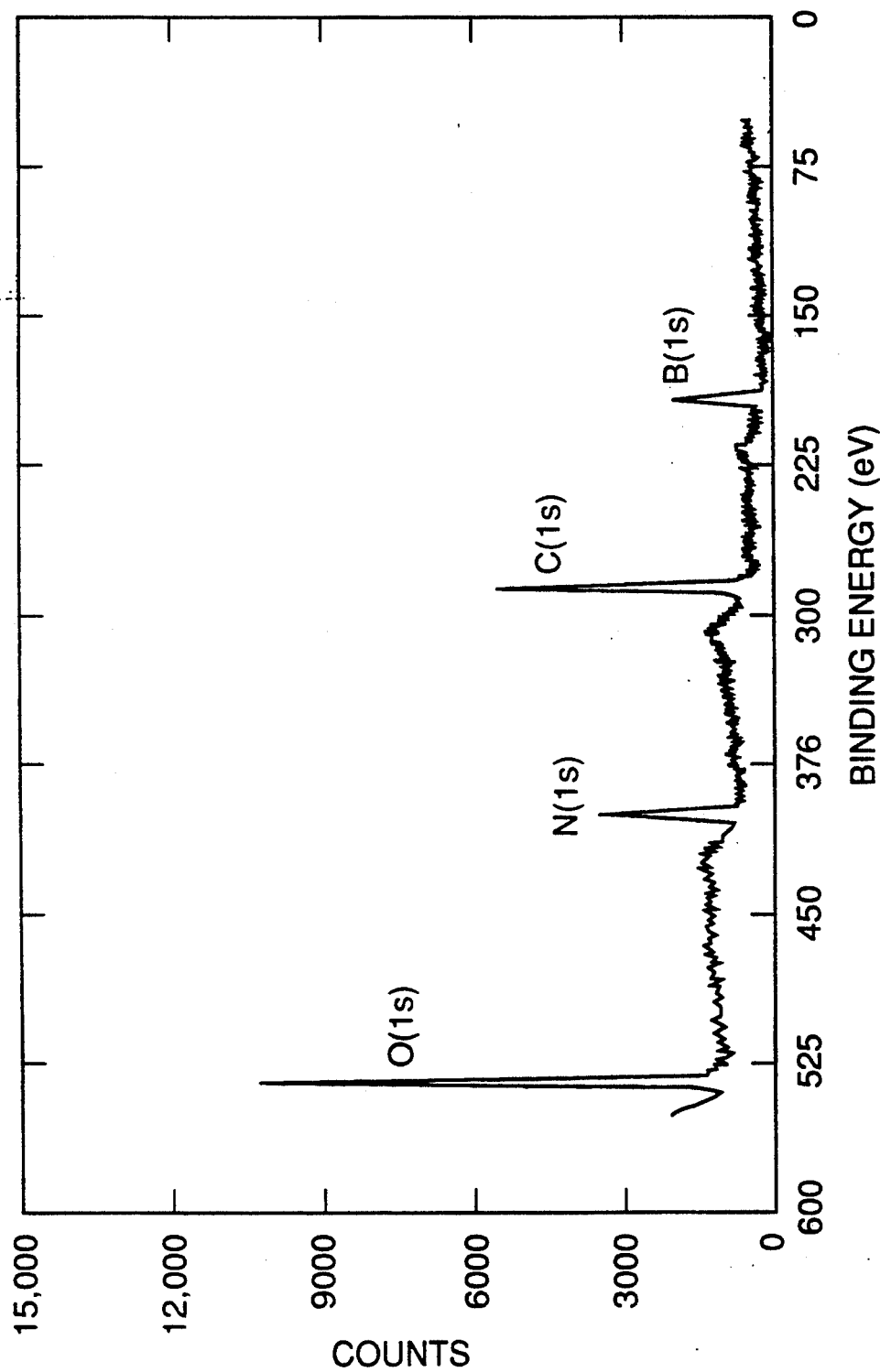
FIG. 4b is a graph showing an XPS survey spectrum of a crude film deposited according to the invention.
Figure 4C:
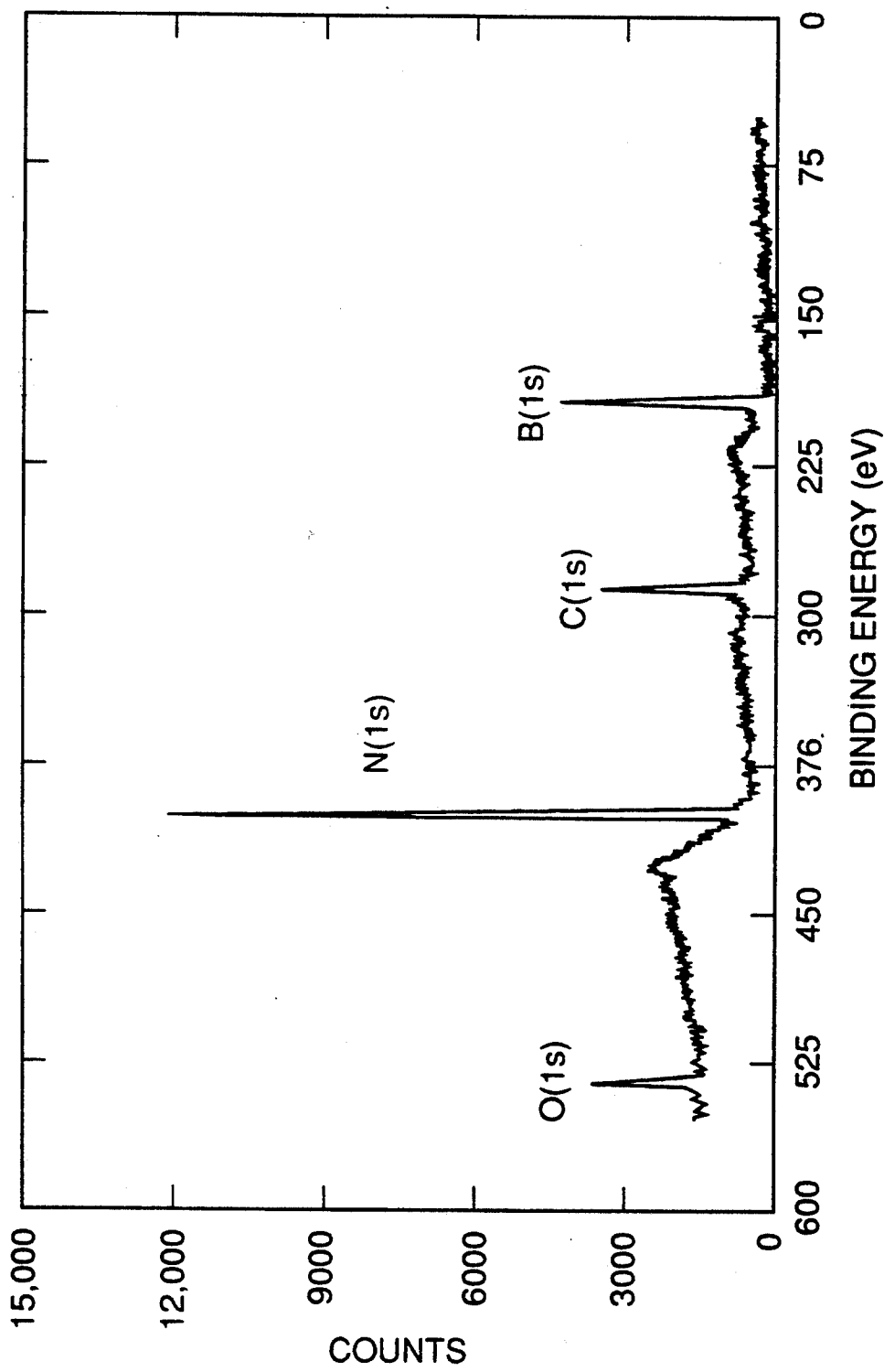
FIG. 4c is a graph showing an XPS survey spectrum of an ammonia treated film deposited according to the invention.
Figure 5B:
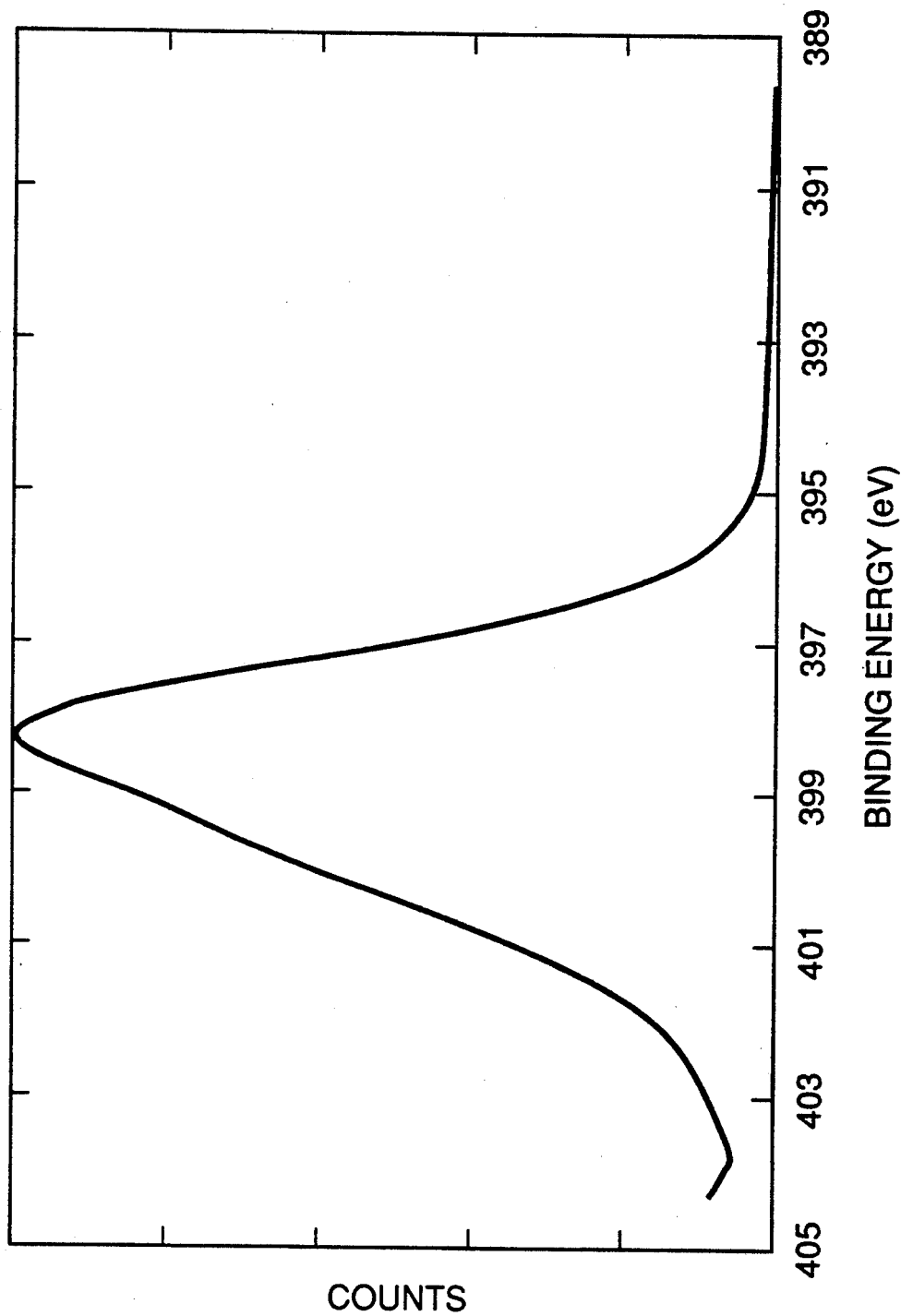
FIG. 5b is a graph showing an XPS nitrogen 1s peak of a crude film deposited according to the invention.
Figure 5C:
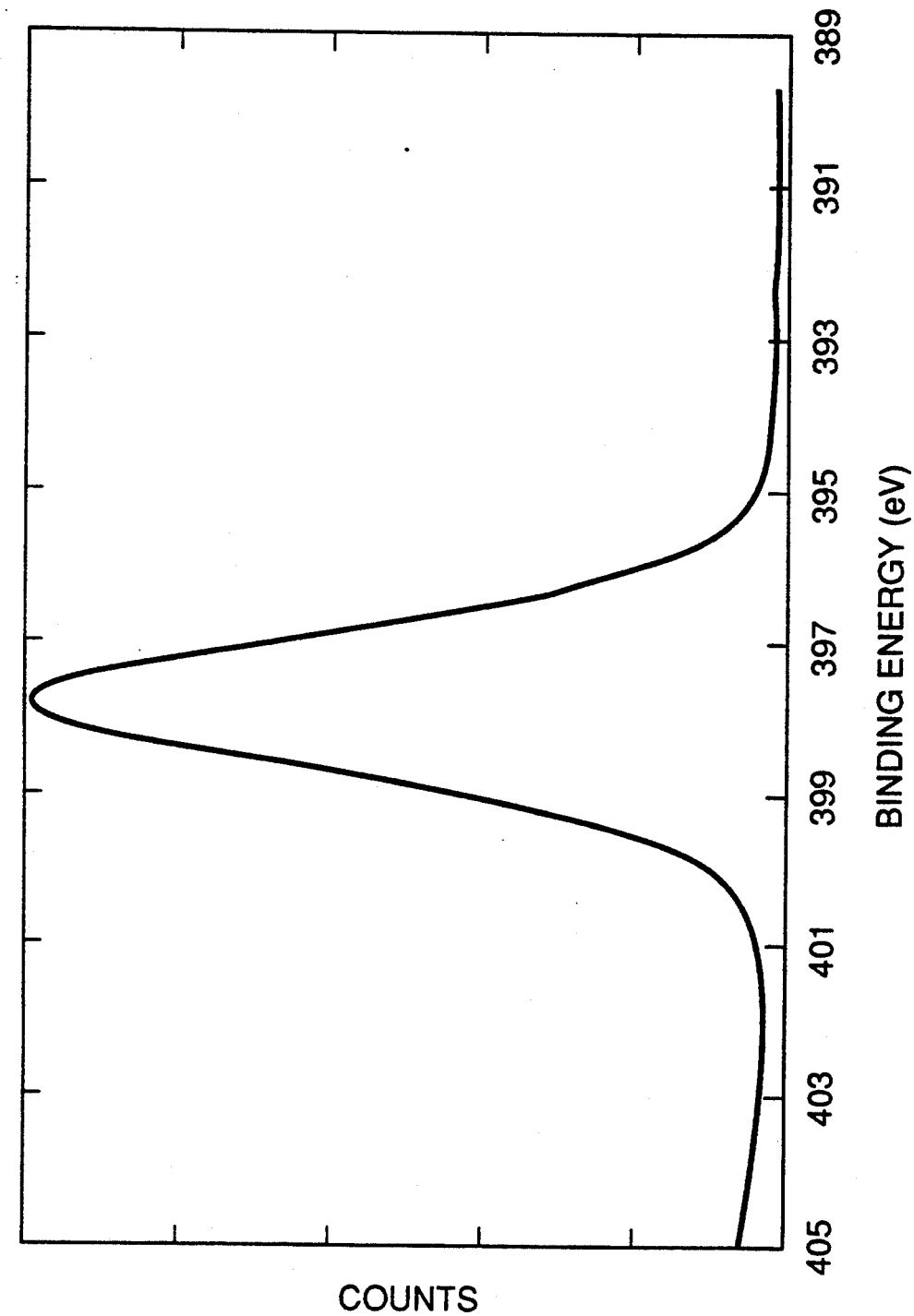
FIG. 5c is a graph showing an XPS nitrogen 1s peak of an ammonia treated film deposited according to the invention.

X-ray photoelectron spectroscopy (XPS) spectra were obtained using Al Kα radiation at 250 watts. The $C_{1s}$ peak at 284.6 eV was used to reference the reported binding energies. Auger spectra were obtained with a 3 keV primary electron (a 10 nA current) impinged at 55° with respect to the surface normal. These conditions were chosen because of the high degree of charging potential observed with these specimens. The results of Auger and XPS analyses are given in Tables I and II, respectively. An authentic sample of bulk boron nitride was also analyzed to derive a boron sensitivity factor closely related to the samples examined. A sputter depth profile of the crude film is shown in FIG. 3. The profile reveals a relatively high oxygen concentration at the surface. This element is sputtered away very quickly while the nitrogen, carbon, and boron concentrations remain constant through the thickness of the film, which was established to be about 1 μm. The actual thickness calculated on the basis of sputtering efficiencies of $Ta_2O_5$ was 10600 Å. Breakthrough to the substrate is clearly revealed by the silicon signal. A sputter depth profile could not be obtained from the ammonia treated film because of excessive interference of charging effects. Survey spectra of a BN standard, crude BN film, and ammonia treated BN film, obtained by XPS are shown in FIGS. 4a, 4b, and 4c, respectively. Closer examination at a higher resolution for each specific element revealed a coincidence in peak position as well as width. On the other hand, the crude film shows broader B and N peaks. Expanded views of the nitrogen peak of a BN standard, crude BN film, and ammonia treated BN film are shown in FIGS. 5a, 5b, and 5c, respectively. The crude film shows components with higher binding energies. A very similar profile is observed in the boron peak. These signals were deconvoluted and the resulting values are included in Table II. It is seen that a portion of the boron and nitrogen in the film is already constituted as boron nitride. Final conversion of the remaining nitrogen and boron into boron nitride apparently takes place as a result of the ammonia treatment.

TABLE I
EXPERIEMENTAL AUGER ATOMIC CONCENTRATIONS

| SAMPLE | ATOM PERCENT FROM MULI-PLEXED SPECTRA | | | | SAMPLE ANALYSIS DEPTH(Å) | AREA μm |
|---|---|---|---|---|---|---|
| | B | N | C | O | | |
| BN STANDARD | 34.9 | 35.8 | 27.2 | 2.1 | surface | 670 × 500 |
| | 45.7 | 42.0 | 12.6 | — | surface | point |
| CRUDE FILM | 18.8 | 11.2 | 48.9 | 21.1 | surface | 670 × 500 |
| | 34.3 | 21.2 | 41.3 | 3.3 | 420 | 670 × 500 |
| | 35.0 | 23.5 | 35.0 | — | 10000 | point |
| $NH_3$ TREATED | 33.5 | 39.6 | 23.0 | 4.0 | surface | 268 × 200 |
| | 38.2 | 36.3 | 13.3 | 12.2 | 225 | point |

TABLE II
XPS EXPERIMENTAL BINDING ENERGIES AND ATOMIC CONCENTRATIONS

| SAMPLE | ATOM PERCENT | | | | BINDING ENERGY (eV) | | | |
|---|---|---|---|---|---|---|---|---|
| | B | N | C | O | B | N | C | O |
| BN STANDARD | 47.4 | 43.1 | 5.8 | 3.4 | 190.5 | 397.8 | 284.6 | 532.0 |
| BN FILM - $NH_3$ TREATED | 40.1 | 37.2 | 17.3 | 5.4 | 190.4 | 397.8 | 284.6 | 532.1 |
| BN FILM - NOT $NH_3$ TREATED (COMPONENTS) | 25.4* | 15.2** 0.8 | 36.0 | 23.4 | 192.1 190.2 | 402.5 400.0 398.0 | 284.6 (B—N compound) (BN) | 531.8 |
| | 17.1 | 5.0 | | | | | | |
| | 8.2 | 9.3 | | | | | | |

*Two boron species deconvoluted
**Three nitrogen species deconvoluted

Discrepancies between the chemical analysis and compositions derived by XPS and AES are very likely due to the fact that the spectroscopic techniques are localized either in depth or in area and are sensitive to surface contaminations.

Establishing the mechanical properties of the ammonia treated film was important for the characterization of this coating since the material proved to be amorphous. The measured hardness was found to be about 0.86 GPa which corresponds to a Knoop hardness of about 88. This value is closer to that of hot isostatically pressed BN than to that of cubic BN (in the 1000 to 3000 range). The measured bulk modulus was approximately 6 GPa.

The pyrolysis of polymeric cyanoborane proceeds with the production of small amounts of hydrogen cyanide, about 0.07 mmole/mmole starting material. This product was measured and identified by IR after being trapped downstream from the CVD reactor. Methane was also detected as a by-product of the pyrolysis by an on-line mass analyzer attached to the vacuum line. It is significant that detectable boron-containing species are not evolved in the pyrolysis, which indicates great efficiency of the process for depositing the boron-containing species onto surfaces.

Plasma Enhanced CVD

In addition to the above described thermally activated method, a plasma enhanced CVD (PECVD) method is also quite suitable for carrying out the present invention. The potential benefits of conducting PECVD are a decrease in processing temperatures and the possibility of generating a different crystalline phase not accessible through thermal activation alone. PECVD of BN can proceed with no external heating; the substrate becomes heated only to about 240° C. The PECVD method yields boron nitride coatings containing about 20 wt % paracyanogen, which can be removed by heat treatment under vacuum or in an ammonia atmosphere. The boron nitride coatings produced by PECVD are generally of hexagonal crystalline structure and appear to be boron deficient.

Figure 6:
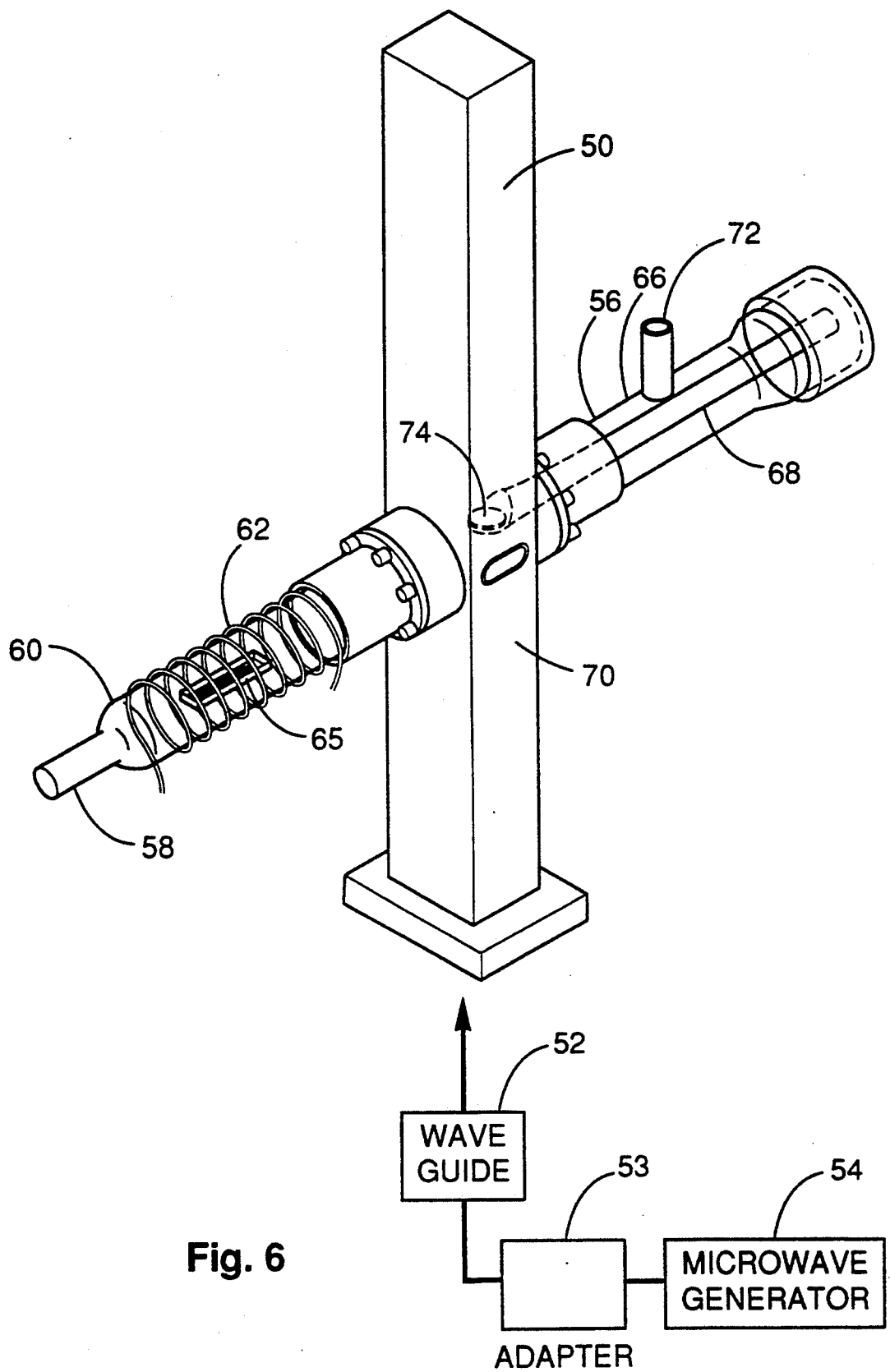
FIG. 6 is an oblique side view of apparatus suitable for carrying out a plasma enhanced method according to the invention.

FIG. 6 is an oblique side view of apparatus suitable for carrying out a plasma enhanced method according to the invention. Referring thereto, a typical apparatus includes a microwave plasma source 50 suitable for PECVD processes. Microwave or RF energy is supplied through a waveguide 52 from a microwave power generator 54, such as model PGM 30, Raytheon Co., Waltham, Mass. An adapter 53 may be required for conversion from coaxial cable to waveguide 52. The PECVD reactor 56 is a straight quartz tube passing through the plasma source 50. The upstream end-portion 58 of the reactor 56, serves as an inlet for nitrogen. The upstream mid-portion 60 of the reactor 56 is wound with heating means 62 such as a mantle or heat tape. The upstream mid-portion 60 of the reactor 56 houses a boat 65 for containing cyanoborane. The downstream portion 66 of the reactor 56 houses a quartz holder 68. The downstream portion 66 of the reactor 56 is connected to a vacuum source through a side arm 72. The holder 68, shown in the closed position, extends into the center 70 of the microwave plasma source 50, where it supports a substrate 74 to be coated.

A PECVD method of depositing BN on a substrate according to the invention is described as follows. Cyanoborane is placed in the boat 65 and loaded into the upstream mid-portion 60 of the reactor 56. A suitable substrate is placed in the holder 68 and inserted into the center 70 of the microwave plasma source 50. Nitrogen is passed through the reactor 56, and microwave energy is fed to the microwave plasma source 50 so that the substrate is immersed in a nitrogen plasma. The heating means 62 is heated slowly to a temperature in the range of about 80° C. to about 300° C., more preferably in the range of about 140° C. to about 200° C., most preferably about 170° C. to evaporate the cyanoborane. The vaporous cyanoborane enters the microwave plasma source 50 and interacts with the plasma whereby deposition of a coating comprising BN occurs on the substrate in the holder 68.

EXAMPLE IX

A nitrogen plasma was produced in a microwave cavity receiving about 100 watt net power from a microwave power source. In a typical experiment a portion of cyanoborane, about 50 mg, was evaporated by increasing the temperature to 200° C. through a 2 h period while maintaining a nitrogen flow of 20 mL/min and a pressure of 1 torr. The run would continue for 2-4 hours. No external heating was provided at the cavity other than the plasma power itself.

The films produced were pale yellow, as could be observed on the walls of the reactor. The films on silicon substrates were about 1-3 micron in thickness and created interference patterns. On the other hand, quartz substrates collected very thin coatings, <1 micron thick, of a whitish film. The condensable volatiles produced during the deposition were trapped downstream and amounted to about 0.2 mole/mole initial cyanoborane loaded. Analysis by FTIR revealed HCN and NH$_3$. These results are in contrast with the thermally activated CVD which produced about 0.07 mole/mole cyanoborane, consisting basically of HCN. Apparently in the thermally activated process the hydrogen is mostly lost as methane while in the PECVD the hydrogen is extracted in part as ammonia because of the presence of highly activated nitrogen species.

The deposition temperature for the PECVD was established by direct measurement at the end of each run with a thermocouple brought in contact with the back side of the substrate as soon as the plasma was extinguished. Temperatures ranged between 240° C. and 300° C.

The carbon content of two independently prepared films was 10.4 and 12.5 wt % respectively. Treatment of coated specimens in an ammonia atmosphere at about 800° C. lowered the carbon content to that of the blank value given by uncoated specimens. The ammonia treatment of two independently prepared specimens caused a weight loss corresponding to 21.1 and 19.9 wt % of the film. It is seen, that unlike the thermally activated CVD films, there is a discrepancy between the weight loss upon ammonia treatment and the initial carbon content. In the PECVD process there is evidently something else being volatilized. A strong indication that nitrogen is the species being evolved other than carbon was derived from observation of the IR spectra of the crude and ammonia treated films. The IR spectra revealed the presence of CN vibrations, at about 2200 cm$^{-1}$, in the crude film which completely disappeared in the treated film. It is speculated that the conditions of the plasma, highly activated molecular nitrogen, atomic nitrogen and a carbon source (the carbon content of the cyanoborane) might lead to the formation of paracyanogen, which is a polymeric form of cyanogen, $(CN)_2$. A series of experiments were conducted in order to test this hypothesis. Paracyanogen coated specimens were generated in a glow discharge system by sputtering a graphite electrode in a nitrogen plasma. The coated specimens were found to have similar CN bands as the crude boron nitride films. The presence of a stronger band around 1500 cm$-1$ in the paracyanogen would be covered in the crude boron nitride by the very intense 1400 cm$-1$ of BN. The possibility that paracyanogen is present in the crude boron nitride is reinforced by the observation that carbon is eliminated by a thermal treatment under vacuum at about 800° C., as occurs in pure paracyanogen films. The thermal treatment of crude PECVD boron nitride under vacuum also produces elimination of the CN band in the IR spectrum. This is in contrast with the fact that the carbon in crude BN films obtained by thermally activated CVD is not eliminated by vacuum treatment. Paracyanogen films are chemically resistant to attack and show high resistivity properties shared with boron nitride. Therefore, the presence of paracyanogen in the boron nitride would not necessarily detract of the quality of boron nitride. In any event, the paracyanogen may be removed thermally or by ammonia if desired.

PECVD of boron nitride films using polymeric cyanoborane as the source proceeds at significantly lower substrate temperatures than does the thermally activated method, 240° C. to 300° C. rather than about 600° C. The PEVCD method leaves polymeric cyanogen, to the extent of about 20 wt %, in the boron nitride. That impurity may be removed at high temperature under vacuum or in an ammonia atmosphere. The films obtained by PECVD are hexagonal boron nitride. The chemical analysis of the films suggests a boron deficiency.

While there has been shown and described what are at present considered the preferred embodiments of the invention, it will be obvious to those skilled in the art that various changes and modifications can be made therein without departing from the scope of the inventions defined by the appended claims.

What is claimed is:

1. A method of depositing boron nitride onto a substrate comprising the steps of:
   a. providing a substrate, having a surface, said substrate being held at a sufficient temperature to effect decomposition of cyanoborane; and,
   b. contacting said heated substrate with cyanoborane vapor so that a film comprising boron nitride is deposited on said surface to produce a coated substrate.

2. The method of claim 1 wherein said contacting step is carried out under pressure less than atmospheric pressure.

3. The method of claim 1 wherein said sufficient temperature is a temperature in the range of about 400° C. to about 800° C.

4. The method of claim 3 wherein said sufficient temperature is a temperature in the range of about 500° C. to about 700° C.

5. The method of claim 1 further comprising the additional step of contacting said coated substrate with ammonia, said coated substrate being held at a temperature in the range of about 700° C. to about 1200° C.

6. The method of claim 5 wherein said coated substrate is held at a temperature in the range of about 750° C. to about 850° C.

7. A method of depositing boron nitride onto a substrate comprising the steps of:
   a. providing a substrate, having a surface, said substrate being held at a sufficient temperature to effect decomposition of cyanoborane;
   b. thermally vaporizing cyanoborane to form a cyanoborane vapor; and,
   c. contacting said heated substrate with said cyanoborane vapor so that a film comprising boron nitride is deposited on said surface to produce a coated substrate.

8. The method of claim 7 wherein said vaporizing step is carried out under pressure less than atmospheric pressure.

9. The method of claim 7 wherein said contacting step is carried out under pressure less than atmospheric pressure.

10. The method of claim 7 wherein said vaporizing step is carried out at a temperature in the range of about 80° C. to about 300° C.

11. The method of claim 10 wherein said vaporizing step is carried out at a temperature in the range of about 140° C. to about 200° C.

12. The method of claim 7 wherein said contacting step is carried out at a temperature in the range of about 400° C. to about 800° C.

13. The method of claim 12 wherein said contacting step is carried out at a temperature in the range of about 500° C. to about 700° C.

14. The method of claim 7 further comprising the additional step of contacting said coated substrate with ammonia, said coated substrate being held at a temperature in the range of about 700° C. to about 1200° C.

15. The method of claim 14 wherein said coated substrate is held at a temperature in the range of about 750° C. to about 850° C.

16. A method of depositing boron nitride onto a substrate comprising the steps of:
   a. placing a substrate in a plasma of inert gas, said substrate having a surface; and,
   b. contacting said substrate with a cyanoborane vapor so that said plasma decomposes said cyanoborane vapor to form a film comprising boron nitride on said surface to produce a coated substrate.

17. The method of claim 16 wherein said plasma is generated with electromagnetic radiation.

18. The method of claim 17 wherein said electromagnetic radiation comprises microwave radiation.

19. The method of claim 17 wherein said electromagnetic radiation comprises RF radiation.

20. The method of claim 16 wherein said plasma comprises nitrogen.

21. A method of depositing boron nitride onto a substrate comprising the steps of:
   a. providing a substrate, having a surface, said substrate being placed in a plasma of inert gas;
   b. thermally vaporizing cyanoborane to form a cyanoborane vapor; and,
   c. contacting said substrate with said cyanoborane vapor so that said plasma decomposes said cyanoborane vapor to form a film comprising boron nitride on said surface to produce a coated substrate.

22. The method of claim 21 wherein said vaporizing step is carried out at a temperature in the range of about 80° C. to about 300° C.

23. The method of claim 22 wherein said vaporizing step is carried out at a temperature in the range of about 140° C. to about 200° C.

24. The method of claim 21 wherein said plasma is generated with electromagnetic radiation.

25. The method of claim 24 wherein said electromagnetic radiation comprises microwave radiation.

26. The method of claim 24 wherein said electromagnetic radiation comprises RF radiation.

27. The method of claim 21 wherein said plasma comprises nitrogen.

28. The method of claim 21 further comprising the additional step of contacting said coated substrate with ammonia, said coated substrate being held at a temperature in the range of about 700° C. to about 1200° C.

29. The method of claim 28 wherein said coated substrate is held at a temperature in the range of about 750° C. to about 850° C.

* * * * *